(12) United States Patent
Sasaki

(10) Patent No.: US 12,362,145 B2
(45) Date of Patent: Jul. 15, 2025

(54) PLASMA PROCESSING APPARATUS AND PLASMA PROCESSING METHOD

(71) Applicant: TOKYO ELECTRON LIMITED, Tokyo (JP)

(72) Inventor: Yuji Sasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 518 days.

(21) Appl. No.: 17/744,264

(22) Filed: May 13, 2022

(65) Prior Publication Data

US 2022/0367150 A1 Nov. 17, 2022

(30) Foreign Application Priority Data

May 14, 2021 (JP) .................................. 2021-082204
May 12, 2022 (JP) .................................. 2022-078668

(51) Int. Cl.
*H01J 37/32* (2006.01)

(52) U.S. Cl.
CPC .. *H01J 37/32183* (2013.01); *H01J 37/32577* (2013.01); *H01J 37/32715* (2013.01); *H01J 37/32091* (2013.01); *H01J 2237/2007* (2013.01); *H01J 2237/24564* (2013.01)

(58) Field of Classification Search
CPC .......... H01J 37/32183; H01J 37/32577; H01J 37/32715; H01J 37/32091; H01J 2237/2007; H01J 2237/24564
See application file for complete search history.

(56) References Cited

U.S. PATENT DOCUMENTS

| 5,378,311 A * | 1/1995 | Nagayama | H01L 21/02071 |
| | | | 257/E21.256 |
| 2010/0271744 A1* | 10/2010 | Ni | H01L 22/14 |
| | | | 361/233 |
| 2018/0286731 A1* | 10/2018 | Hamaguchi | G03F 7/70708 |

FOREIGN PATENT DOCUMENTS

JP 2019-046997 3/2019

* cited by examiner

*Primary Examiner* — Yuechuan Yu
(74) *Attorney, Agent, or Firm* — XSENSUS LLP

(57) ABSTRACT

A plasma processing apparatus includes an electrostatic chuck including an electrode, a first switch, a second switch, and a control unit. The control unit controls the first switch and the second switch to be in a closed state, causes a power supply to output a first voltage, and determines that the first switch and the second switch are in the closed state when the first voltage is detected by a detector. Further, after it is determined that the first switch and the second switch are in the closed state, the control unit controls the first switch and the second switch to be in an open state to start a processing of the substrate using the plasma in a state where the electrode is controlled to be in a floating state.

7 Claims, 8 Drawing Sheets

PLASMA PROCESSING APPARATUS AND PLASMA PROCESSING METHOD

CROSS-REFERENCE TO RELATED APPLICATIONS

This application is based on and claims priority from Japanese Patent Application No. 2021-082204, filed May 14, 2021, and Japanese Patent Application No. 2022-078668, filed May 12, 2022, respectively, all of which are incorporated herein in their entirety by reference.

TECHNICAL FIELD

Various aspects and embodiments of the present disclosure relate to a plasma processing apparatus and a plasma processing method.

BACKGROUND

Japanese Patent Laid-Open Publication No. 2019-046997 discloses a plasma processing apparatus in which a switch is provided between an electrode provided on an electrostatic chuck that adsorbs and holds a processing target substrate and a DC power supply that applies a DC voltage to the electrode.

SUMMARY

An aspect of the present disclosure is a plasma processing apparatus which includes an electrostatic chuck, a first switch, a second switch, and a control unit. The electrostatic chuck is provided in a chamber, has an electrode therein, and is configured to adsorb a substrate to be processed using a plasma by a voltage applied to the electrode. The first switch is provided in a wiring between the electrode and a power supply that supplies the voltage to the electrode. The second switch is provided in a wiring between the electrode and a detector that detects the voltage of the electrode. The control unit is configured to execute a first determination processing of controlling the first switch and the second switch to be in a closed state, controlling the power supply to output a first voltage of a predetermined value, and determining that the first switch and the second switch are in the closed state when the first voltage is detected by the detector. Further, after it is determined that the first switch and the second switch are in the closed state, the control unit is configured to control the first switch and the second switch to be in an open state, thereby starting a processing of the substrate using the plasma in a state where the electrode is controlled to be in a floating state.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of a plasma processing apparatus and a plasma processing method disclosed herein will be described in detail with reference to the drawings. It should be noted that the following embodiments do not limit the disclosed plasma processing apparatus and plasma processing method.

By the way, when a switch provided in a wiring between an electrode in an electrostatic chuck and a power supply that applies a voltage to the electrode is out of order in an open state, no voltage of a desired value is applied to the electrode. When no voltage of a desired value is applied to the electrode, no electrostatic force of a desired value is generated in the electrode, and a substrate is not adsorbed to the electrostatic chuck. This may cause the substrate to move with respect to the electrostatic chuck when the substrate has been processed using a plasma, which reduces the accuracy of a processing on the substrate.

Hence, the present disclosure provides a technique capable of starting a plasma processing after confirming that a substrate is adsorbed to an electrostatic chuck.

[Configuration of Plasma Processing System 100]

Figure 1:
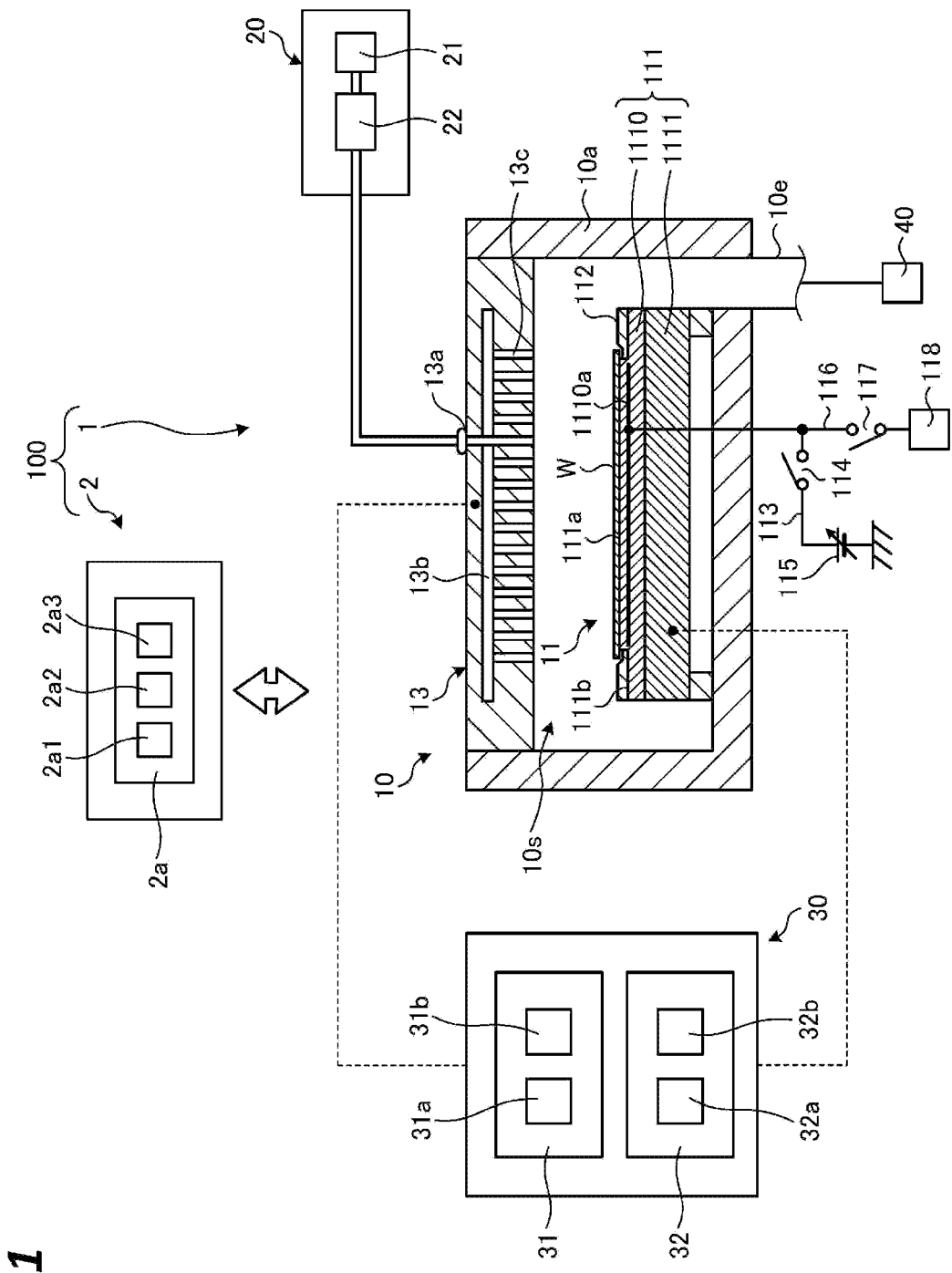
FIG. 1 is a diagram illustrating an example of a plasma processing system according to an embodiment of the present disclosure.

Hereinafter, a configuration example of a plasma processing system 100 will be described. FIG. 1 is a diagram illustrating an example of the plasma processing system 100 according to an embodiment of the present disclosure. The plasma processing system 100 includes a capacitively coupled plasma processing apparatus 1 and a control unit 2. The plasma processing apparatus 1 includes a plasma processing chamber 10, a gas supply unit 20, a power supply 30, and an exhaust system 40. Further, the plasma processing apparatus 1 includes a substrate support 11 and a gas introducer. The gas introducer is configured to introduce at least one processing gas into the plasma processing chamber 10. The gas introducer includes a shower head 13. The substrate support 11 is arranged in the plasma processing chamber 10. The shower head 13 is arranged above the substrate support 11. In one embodiment, the shower head 13 constitutes at least a part of the ceiling of the plasma processing chamber 10.

The plasma processing chamber 10 has a plasma processing space 10s defined by the shower head 13, a sidewall 10a of the plasma processing chamber 10, and the substrate support 11. The plasma processing chamber 10 has at least one gas supply port for supplying at least one processing gas to the plasma processing space 10s, and at least one gas discharge port for discharging the gas from the plasma processing space 10s. The sidewall 10a is grounded. The shower head 13 and the substrate support 11 are electrically insulated from a housing of the plasma processing chamber 10.

The substrate support 11 includes a main body 111 and a ring assembly 112. The main body 111 has a substrate support surface 111a which is a central region for supporting a substrate W, and a ring support surface 111b which is an annular region for supporting the ring assembly 112. The substrate W may also be referred to as a wafer. The ring support surface 111b of the main body 111 surrounds the substrate support surface 111a of the main body 111 in a plan view. The substrate W is disposed on the substrate support surface 111a of the main body 111, and the ring assembly 112 is disposed on the ring support surface 111b of the main body 111 so as to surround the substrate W on the substrate support surface 111a of the main body 111.

In one embodiment, the main body 111 includes an electrostatic chuck 1110 and a base 1111. The base 1111 includes a conductive member. The conductive member of the base 1111 functions as a lower electrode. The electrostatic chuck 1110 is disposed on the base 1111. The upper surface of the electrostatic chuck 1110 is the substrate support surface 111a. The electrostatic chuck 1110 is provided with an electrode 1110a. A variable DC power supply 115 is connected to the electrode 1110a via a wiring 113. The wiring 113 is provided with a first switch 114. The electrode 1110a generates an electrostatic force in the substrate support surface 111a by a DC voltage applied from the variable DC power supply 115 as the first switch 114 is in the closed state. Thus, the electrostatic chuck 1110 adsorbs the substrate W disposed on the substrate support surface 111a. When the substrate W is adsorbed to the electrostatic chuck 1110, a first voltage (hereinafter, sometimes referred to as H voltage) of a predetermined value is applied to the electrode 1110a from the variable DC power supply 115.

Further, in the present embodiment, after the substrate W is adsorbed to the electrostatic chuck 1110, the first switch 114 is controlled to be in the open state, so that the electrode 1110a is in the floating state. In the floating state, the electrode 1110a maintains the electric charge that is accumulated in the electrode 1110a until immediately before the electrode 1110a is in the floating state. Then, after the electrode 1110a is in the floating state, a plasma processing of the substrate W using a plasma is executed. Executing the plasma processing in the floating state of the electrode 1110a suppresses excessive charging of the substrate W during the plasma processing. Further, executing the plasma processing in the floating state of the electrode 1110a suppresses an excessive adsorption force between the substrate W and the electrostatic chuck 1110 during the plasma processing.

Further, a detector 118 is connected to the electrode 1110a via a wiring 116. The wiring 116 is provided with a second switch 117. The detector 118 detects the value of the voltage of the electrode 1110a via the wiring 116 when the second switch 117 is in the closed state. For example, the detector 118 detects the voltage of the electrode 1110a after the electrode 1110a is destaticized after the end of the plasma processing on the substrate W. The control unit 2 determines that the destaticization is completed when the value of the voltage of the electrode 1110a detected by the detector 118 is a second voltage (hereinafter, sometimes referred to as L voltage) lower than the first voltage, and starts the carry-out of the substrate W for which the plasma processing has ended.

Here, when the second switch 117 is not provided and the electrode 1110a and the detector 118 are always connected to each other via the wiring 116, the electric charge accumulated in the electrode 1110a in the floating state thereof leaks through the wiring 116 and the detector 118. When the electric charge accumulated in the electrode 1110a leaks through the wiring 116 and the detector 118, the electric charge accumulated in the electrode 1110a is reduced, so that the adsorption force between the substrate W and the electrostatic chuck 1110 is reduced during the plasma processing. This makes it difficult to maintain the position of the substrate W with respect to the electrostatic chuck 1110 at a predetermined position.

Hence, in the present embodiment, the second switch 117 is provided in the wiring 116 and is controlled to be in the closed state only when it is required to detect the voltage of the electrode 1110a. In particular, the second switch 117 is controlled to be in the open state during the plasma processing. This suppresses a reduction in the electric charge accumulated in the electrode 1110a in the floating state thereof during the plasma processing, thus suppressing a reduction in the adsorption force between the substrate W and the electrostatic chuck 1110. This makes it possible to maintain the position of the substrate W with respect to the electrostatic chuck 1110 at a predetermined position.

However, when the first switch 114 is out of order in the open state, the first switch 114 is not in the closed state even when the control unit 2 controls the first switch 114 to be in the closed state. In the following, the state of the switch where the switch remains in the open state even when it is controlled to be in the closed state will be described as an open failure. When the first switch 114 has an open failure, no voltage is applied to the electrode 1110a and the substrate W is not adsorbed to the electrostatic chuck 1110. In order for the substrate W to be adsorbed to the electrostatic chuck 1110, it is necessary to take measures such as confirming that the first switch 114 has no open failure and stopping the plasma processing when the first switch 114 has an open failure. Hence, in the present embodiment, it is confirmed that the first switch 114 has no open failure before starting the plasma processing.

Further, when the first switch 114 is out of order in the closed state, the first switch 114 is not in the open state even when the control unit 2 controls the first switch 114 to be in the open state. In the following, the state of the switch where the switch remains in the closed state even when it is controlled to be in the open state will be described as a closure failure. When the first switch 114 has a closure failure, the electrode 1110a cannot be in the floating state, which may cause the substrate W to be excessively charged during the plasma processing or generate an excessive adsorption force between the substrate W and the electrostatic chuck 1110. When an excessive adsorption force is generated between the substrate W and the electrostatic chuck 1110, particles are generated due to friction between the substrate W and the electrostatic chuck 1110. Further, when the substrate W is excessively charged, particles are likely to adhere to the substrate W. Therefore, it is necessary to confirm that the first switch 114 has no closure failure. Then, when the first switch 114 has a closure failure, it is necessary to take measures such as stopping the plasma processing. Hence, in the present embodiment, it is confirmed that the first switch 114 has no closure failure.

The ring assembly 112 includes one or a plurality of annular members. One or at least one of the plurality of annular members is an edge ring. Further, although not illustrated, the substrate support 11 may include a temperature adjustment module configured to adjust at least one of the electrostatic chuck 1110, the ring assembly 112, and the substrate W to a target temperature. The temperature adjustment module may include a heater, a heat transfer medium, a flow path, or a combination thereof. A heat transfer fluid such as a brine or gas flows through the flow path. Further, the substrate support 11 may include a heat transfer gas supply configured to supply a heat transfer gas between the substrate W and the substrate support surface 111a.

The shower head 13 is configured to introduce at least one processing gas from the gas supply unit 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the gas introduction ports 13c. Further, the shower head 13 includes a conductive member. The conductive member of the shower head 13 functions as an upper electrode. In addition to the shower head 13, the gas introducer may include one or a plurality of side gas injectors (SGI) attached to one or a plurality of openings formed in the sidewall 10a.

The gas supply unit 20 may include at least one gas source 21 and at least one flow rate controller 22. In one embodiment, the gas supply unit 20 is configured to supply at least one processing gas from the corresponding gas source 21 to the shower head 13 via the corresponding flow rate controller 22. Each flow rate controller 22 may include, for example, a mass flow controller or a pressure-controlled flow rate controller. The gas supply unit 20 may further include one or more flow rate modulation devices that modulate or pulse the flow rate of at least one processing gas.

The power supply 30 includes a Radio Frequency (RF) power supply 31 coupled to the plasma processing chamber 10 via at least one impedance matching circuit. The RF power supply 31 is configured to supply at least one RF signal, such as a source RF signal and a bias RF signal, to the conductive member of the substrate support 11, the conductive member of the shower head 13, or both. Thus, a plasma is formed from at least one processing gas supplied to the plasma processing space 10s. Thus, the RF power supply 31 may function as at least a part of a plasma generator configured to generate a plasma from one or more processing gases in the plasma processing chamber 10. Further, when supplying the bias RF signal to the conductive member of the substrate support 11, a bias potential may be generated in the substrate W, thus attracting an ionic component in the formed plasma to the substrate W.

In one embodiment, the RF power supply 31 includes a first RF generator 31a and a second RF generator 31b. The first RF generator 31a is coupled to the conductive member of the substrate support 11, the conductive member of the shower head 13, or both via at least one impedance matching circuit, thereby generating a source RF signal for plasma generation. The source RF signal may be referred to as source RF power. In one embodiment, the source RF signal has a signal with a frequency within a range from 13 MHz to 150 MHz. In one embodiment, the first RF generator 31a may be configured to generate a plurality of source RF signals with different frequencies. The generated one or plurality of source RF signals are supplied to the conductive member of the substrate support 11, the conductive member of the shower head 13, or both.

The second RF generator 31b is coupled to the conductive member of the substrate support 11 via at least one impedance matching circuit and is configured to generate a bias RF signal. The bias RF signal may be referred to as bias RF power. In one embodiment, the bias RF signal has a lower frequency than the source RF signal. In one embodiment, the bias RF signal has a signal with a frequency within a range from 400 kHz to 13.56 MHz. In one embodiment, the second RF generator 31b may be configured to generate a plurality of bias RF signals with different frequencies. The generated one or plurality of bias RF signals are supplied to the conductive member of the substrate support 11. Further, in various embodiments, at least one of the source RF signal and the bias RF signal may be pulsed.

Further, the power supply 30 may include a Direct Current (DC) power supply 32 coupled to the plasma processing chamber 10. The DC power supply 32 includes a first DC generator 32a and a second DC generator 32b. In one embodiment, the first DC generator 32a is connected to the conductive member of the substrate support 11 and is configured to generate a first DC signal. The generated first DC signal is applied to the conductive member of the substrate support 11. In another embodiment, the first DC signal may be applied to another electrode such as the electrode 1110a in the electrostatic chuck 1110. In one embodiment, the second DC generator 32b is connected to the conductive member of the shower head 13 and is configured to generate a second DC signal. The generated second DC signal is applied to the conductive member of the shower head 13. In various embodiments, at least one of the first and second DC signals may be pulsed. The first DC generator 32a and the second DC generator 32b may be provided in addition to the RF power supply 31, and the first DC generator 32a may be provided in place of the second RF generator 31b.

The exhaust system 40 may be connected to, for example, a gas outlet 10e formed in the bottom of the plasma processing chamber 10. The exhaust system 40 may include a pressure regulating valve and a vacuum pump. The pressure regulating valve regulates the pressure in the plasma processing space 10s. The vacuum pump may include a turbo molecular pump, a dry pump, or a combination thereof.

The control unit 2 processes computer-executable instructions that cause the plasma processing apparatus 1 to perform various processes described in the present disclosure. The control unit 2 may be configured to control each element of the plasma processing apparatus 1 in order to execute various processes described herein. In one embodiment, a part or the entirety of the control unit 2 may be included in the plasma processing apparatus 1. The control unit 2 may include, for example, a computer 2a. The computer 2a may include, for example, a processor 2a1, a memory 2a2, and a communication interface 2a3. The processor 2a1 may be configured to perform various control operations based on programs stored in the memory 2a2. The processor 2a1 may include a central processing unit (CPU). The memory 2a2 may include a random access memory (RAM), a read only memory (ROM), a hard disk drive (HDD), a solid state drive (SSD), or a combination thereof. The communication interface 2a3 communicates with the plasma processing apparatus 1 via a communication line such as a local area network (LAN).

[Plasma Processing Method]

Figure 2:
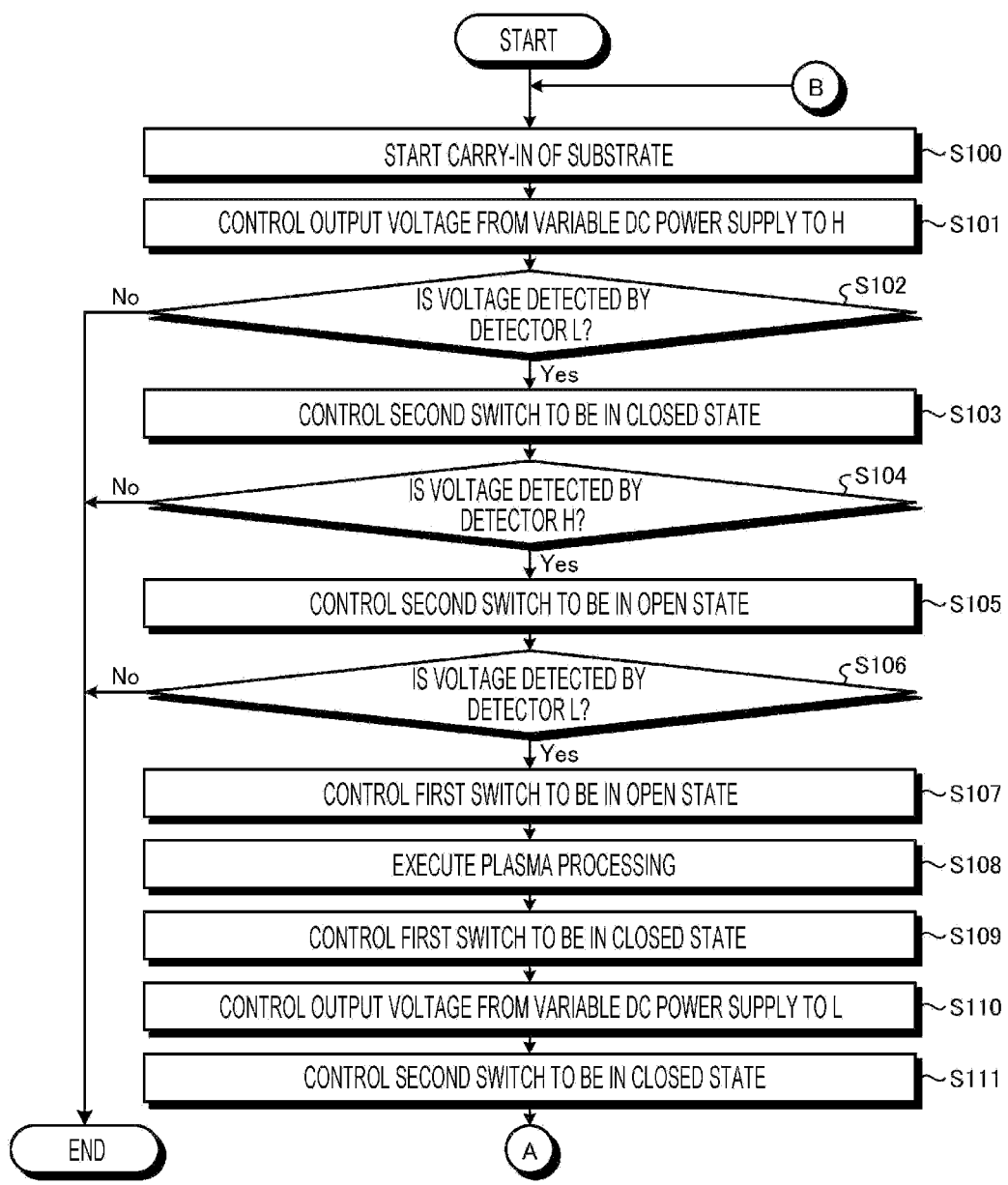
FIG. 2 is a flowchart illustrating an example of a plasma processing method according to an embodiment of the present disclosure.
Figure 3:
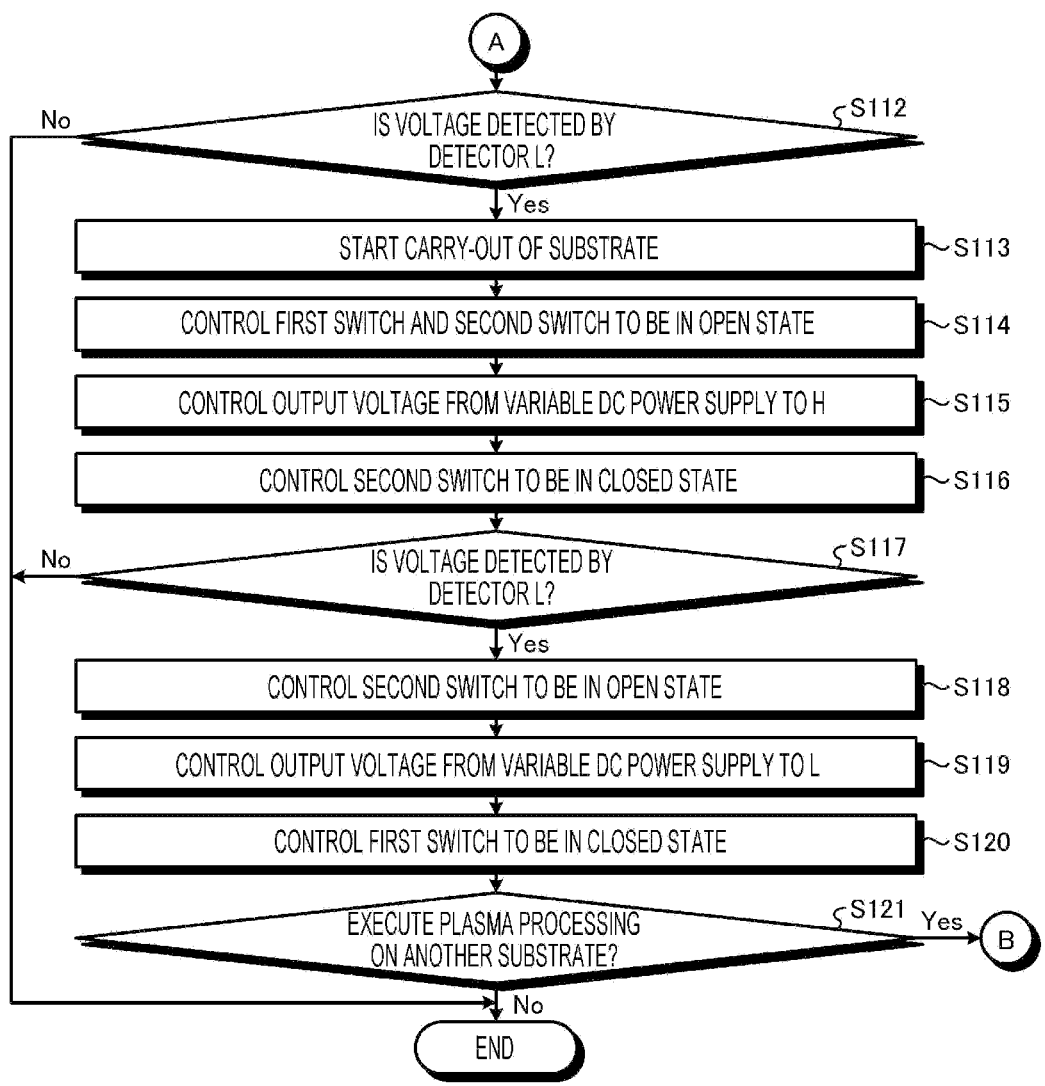
FIG. 3 is a flowchart illustrating an example of a plasma processing method according to an embodiment of the present disclosure.

FIGS. 2 and 3 are flowcharts illustrating an example of a plasma processing method according to one embodiment of the present disclosure. Each processing illustrated in FIGS. 2 and 3 is realized as the control unit 2 controls each part of the plasma processing apparatus 1. The following description will be given with reference to the time chart illustrated in FIG. 4.

Figure 4:
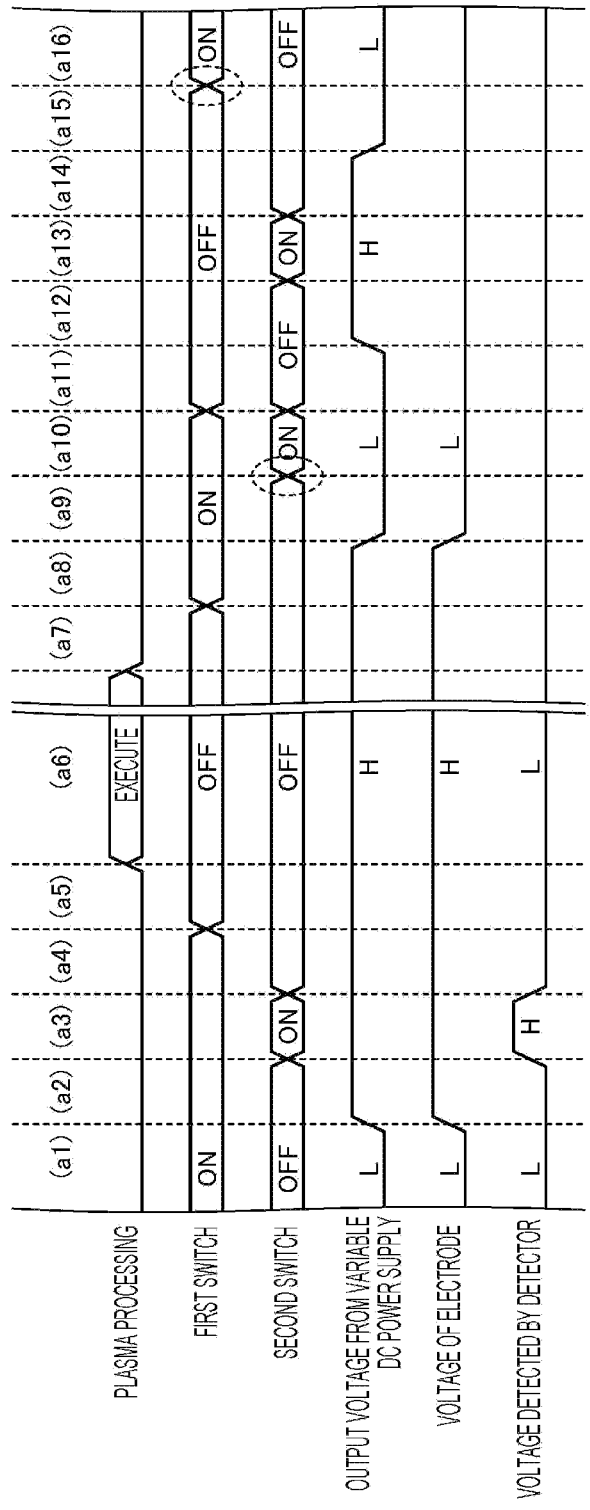
FIG. 4 is a time chart illustrating an example of a control procedure.

In the plasma processing method illustrated in FIGS. 2 and 3, in the initial state (period (a1) illustrated in FIG. 4), the first switch 114 is controlled to be in the closed state, the second switch 117 is controlled to be in the open state, and the L voltage is output from the variable DC power supply 115. Therefore, as illustrated in the period (a1) illustrated in FIG. 4, the voltage of the electrode 1110*a* in the electrostatic chuck 1110 is the L voltage, and the voltage detected by the detector 118 is also the L voltage. In the example of FIG. 4, the closed state of each switch is described as "ON," and the open state thereof is described as "OFF."

First, the control unit 2 controls a transfer device (not illustrated) to start the carry-in of the substrate W into the plasma processing chamber 10 (S100).

Next, the control unit 2 controls the output voltage of the variable DC power supply 115 to the H voltage (S101). The processing of step S101 is an example of step a). Thus, in the period (a2) illustrated in FIG. 4, the output voltage from the variable DC power supply 115 is the H voltage. Here, when the first switch 114 is in the closed state, in the period (a2) illustrated in FIG. 4, the voltage of the electrode 1110*a* in the electrostatic chuck 1110 is the H voltage, and the voltage detected by the detector 118 is the L voltage. Meanwhile, when the first switch 114 is in the open state, in the period (a2) illustrated in FIG. 4, the voltage of the electrode 1110*a* remains the L voltage, and the voltage detected by the detector 118 also remains the L voltage.

Figure 5:
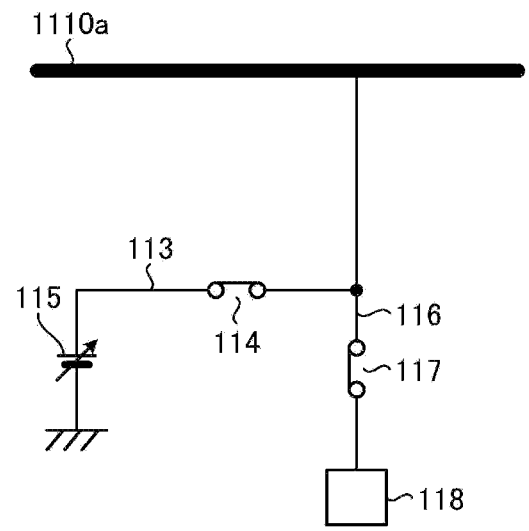
FIG. 5 is a diagram illustrating an example of the states of a first switch and a second switch.

Next, the control unit 2 determines whether or not the voltage detected by the detector 118 is the L voltage (S102). Even when the first switch 114 is controlled to be in the closed state and the second switch 117 is controlled to be in the open state, the voltage detected by the detector 118 is the H voltage when the first switch 114 and the second switch 117 are in the closed state as illustrated in, for example, FIG. 5. In the example of FIG. 5, the second switch 117 is in the closure failure state because the second switch 117 is in the closed state, although the second switch 117 is controlled to be in the open state.

When the voltage detected by the detector 118 is the H voltage (S102: No), the plasma processing method illustrated in FIGS. 2 and 3 ends without starting a plasma processing because the second switch 117 has a closure failure.

Figure 6:
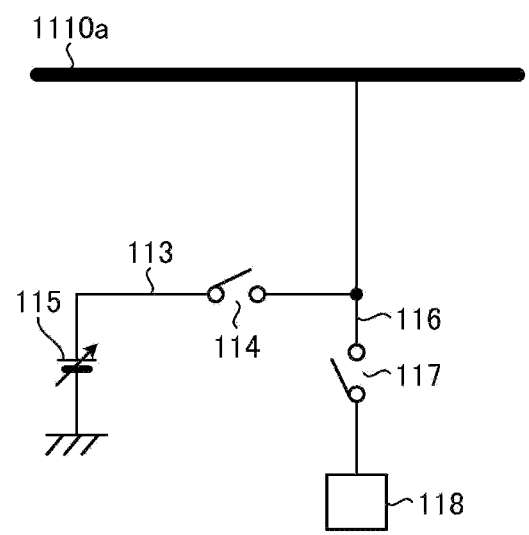
FIG. 6 is a diagram illustrating an example of the states of a first switch and a second switch.
Figure 7:
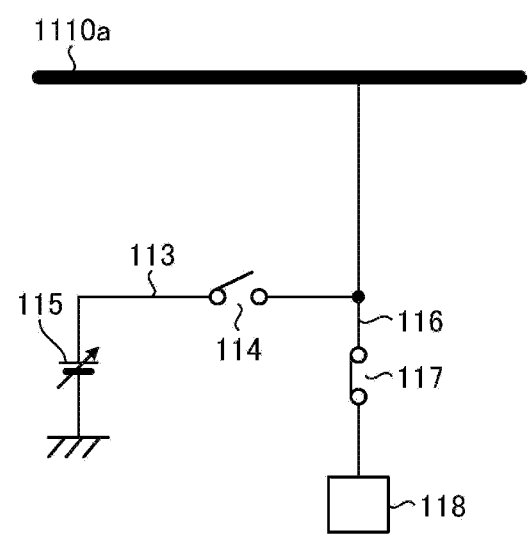
FIG. 7 is a diagram illustrating an example of the states of a first switch and a second switch.

Meanwhile, when the voltage detected by the detector 118 is the L voltage (S102: Yes), the control unit 2 controls the second switch 117 to be in the closed state (S103). Thus, in the period (a3) illustrated in FIG. 4, the second switch 117 is controlled to be in the closed state. The processing of step S103 is an example of step b). Even when the voltage detected by the detector 118 is the L voltage in step S102, the first switch 114 may have an open failure as illustrated in, for example, FIG. 6. Alternatively, even when the voltage detected by the detector 118 is the L voltage, the first switch 114 may have an open failure and the second switch 117 may have a closure failure as illustrated in, for example, FIG. 7.

Next, the control unit 2 determines whether or not the voltage detected by the detector 118 is the H voltage (S104). When the voltage detected by the detector 118 is the L voltage (S104: No), at least one of the first switch 114 and the second switch 117 has an open failure. Therefore, the plasma processing method illustrated in FIGS. 2 and 3 ends without starting a plasma processing.

Meanwhile, when the voltage detected by the detector 118 is the H voltage (S104: Yes), in the period (a3) illustrated in FIG. 4, the first switch 114 and the second switch 117 are in the closed state as controlled by the control unit 2. This confirms that the first switch 114 and the second switch 117 at least have no open failure. When the first switch 114 has no open failure, the voltage output from the variable DC power supply 115 is applied to the electrode 1110*a* via the first switch 114, and the substrate W is adsorbed to the electrostatic chuck 1110. By confirming that the first switch 114 at least has no open failure, it may be confirmed that the substrate W is adsorbed to the electrostatic chuck 1110. Accordingly, a plasma processing may start after confirming that the substrate W is adsorbed to the electrostatic chuck 1110. The processing of step S104 is an example of a first determination processing and step c).

Next, the control unit 2 controls the second switch 117 to be in the open state (S105). In step S105, in the period (a4) illustrated in FIG. 4, the second switch 117 is controlled to be in the open state.

Next, the control unit 2 determines whether or not the voltage detected by the detector 118 is the L voltage (S106). When the voltage detected by the detector 118 is the H voltage (S106: No), the plasma processing method illustrated in FIGS. 2 and 3 ends without starting a plasma processing because the second switch 117 has a closure failure. This may prevent the electric charge accumulated in the electrode 1110*a* in the floating state thereof from leaking through the wiring 116 and the detector 118 during the plasma processing, and thus the adsorption force between the substrate W and the electrostatic chuck 1110 from being reduced.

Meanwhile, when the voltage detected by the detector 118 is the L voltage (S106: Yes), it is confirmed that the second switch 117 has no closure failure because it is confirmed in step S104 that the first switch 114 has no open failure. The processing of step S106 is an example of a second determination processing.

Next, the control unit 2 controls the first switch 114 to be in the open state (S107). In step S107, in the period (a5) illustrated in FIG. 4, the first switch 114 is controlled to be in the open state. When the first switch 114 is in the open state, the electrode 1110*a* of the electrostatic chuck 1110 is in the floating state. The processings of steps S101 to S107 are executed while the carry-in of the substrate W is conducted before a plasma processing.

Next, the control unit 2 executes a plasma processing on the substrate W (S108). In step S108, the plasma processing is executed in the period (a6) illustrated in FIG. 4. Then, the plasma processing ends in the period (a7) illustrated in FIG. 4. The processing of step S108 is an example of step d).

Next, the control unit 2 controls the first switch 114 to be in the closed state (S109). In step S109, in the period (a8) illustrated in FIG. 4, the first switch 114 is in the closed state because it is confirmed in step S104 that the first switch 114 has no open failure.

Next, the control unit 2 controls the output voltage of the variable DC power supply 115 to the L voltage (S110). In step S110, in the period (a9) illustrated in FIG. 4, the output voltage of the variable DC power supply 115 is controlled to the L voltage. Thus, the electric charge accumulated in the electrode 1110*a* flows through the variable DC power supply 115, so that the electrode 1110*a* is destaticized. In the present embodiment, when the electrode 1110*a* is destaticized, the voltage of the electrode 1110a is the same L voltage as the output voltage of the variable DC power supply 115.

Next, the control unit 2 controls the second switch 117 to be in the closed state (S111). In step S111, in the period (a10) illustrated in FIG. 4, the second switch 117 is controlled to be in the closed state. It was confirmed in step S104 that the first switch 114 and the second switch 117 have no open failure. Therefore, in the period (a10), the second switch 117 is controlled to be in the closed state, so that the detector 118 may detect the voltage of the electrode 1110a.

The lifespan of the switch is prolonged when the switch is changed in a state where a low voltage is applied thereto. Although the second switch 117 is changed from the open state to the closed state at a transition from the period (a9) to the period (a10) illustrated in FIG. 4, the voltage of the wiring 116 provided with the second switch 117 is the L voltage at that time. This may prolong the lifespan of the second switch 117.

Next, the control unit 2 determines whether or not the voltage detected by the detector 118 is the L voltage (S112 in FIG. 3). The processing of step S112 is an example of a third determination processing. When the voltage detected by the detector 118 is the H voltage (S112: No), the electrode 1110a is not sufficiently destaticized. When the electrode 1110a is not sufficiently destaticized, the substrate W may jump up or crack when the processed substrate W is separated from the electrostatic chuck 1110 by a lift pin (not illustrated). Therefore, the control unit 2 stops the carry-out of the plasma-processed substrate W and ends the plasma processing method illustrated in FIGS. 2 and 3.

Meanwhile, when the voltage detected by the detector 118 is the L voltage (S112: Yes), the electrode 1110a is sufficiently destaticized, so that the control unit 2 starts the carry-out of the plasma-processed substrate W (S113). In step S113, a drive unit (not illustrated) that drives the lift pin so as to lift the substrate W by the lift pin is controlled by the control unit 2.

Next, the control unit 2 controls the first switch 114 and the second switch 117 to be in the open state (S114). In step S114, in the period (a11) illustrated in FIG. 4, the first switch 114 and the second switch 117 are controlled to be in the open state.

Next, the control unit 2 controls the output voltage of the variable DC power supply 115 to the H voltage (S115). In step S115, in the period (a12) illustrated in FIG. 4, the output voltage of the variable DC power supply 115 is controlled to the H voltage.

Next, the control unit 2 controls the second switch 117 to be in the closed state (S116). In step S116, in the period (a13) illustrated in FIG. 4, the second switch 117 is controlled to be in the closed state. Since it was confirmed in step S104 that the second switch 117 has no open failure, the second switch 117 is controlled to be in the closed state in the period (a13), so that the detector 118 may detect the voltage of the electrode 1110a.

Next, the control unit 2 determines whether or not the voltage detected by the detector 118 is the L voltage (S117). When the voltage detected by the detector 118 is the H voltage (S117: No), the first switch 114 has a closure failure, so that the plasma processing for a next substrate W stops and the plasma processing method illustrated in FIGS. 2 and 3 ends.

Meanwhile, when the voltage detected by the detector 118 is the L voltage (S117: Yes), it is confirmed that the first switch 114 has no closure failure because it was confirmed in step S104 that the second switch 117 has no open failure. The processing of step S117 is an example of a fourth determination processing.

Next, the control unit 2 controls the second switch 117 to be in the open state (S118). In step S118, in the period (a14) illustrated in FIG. 4, the second switch 117 is controlled to be in the open state.

Next, the control unit 2 controls the output voltage of the variable DC power supply 115 to the L voltage (S119). In step S119, in the period (a15) illustrated in FIG. 4, the output voltage of the variable DC power supply 115 is controlled to the L voltage.

Next, the control unit 2 controls the first switch 114 to be in the closed state (S120). In step S120, in the period (a16) illustrated in FIG. 4, the first switch 114 is controlled to be in the closed state. The processings of steps S114 to S120 are executed while the plasma-processed substrate W is carried-out. In the example of FIG. 4, after the output voltage of the variable DC power supply 115 is changed from the H voltage to the L voltage at a transition from the period (a14) to the period (a15), the first switch 114 is changed from the open state to the closed state at a transition from the period (a15) to the period (a16). This may prolong the lifespan of the first switch 114.

Next, the control unit 2 determines whether or not to execute a plasma processing on another substrate W (S121). When the plasma processing is executed on the other substrate W (S121: Yes), the control unit 2 again executes the processing illustrated in step S100 of FIG. 2. Meanwhile, when the plasma processing is not executed on the other substrate W (S121: No), the control unit 2 ends the plasma processing method illustrated in FIGS. 2 and 3.

The first embodiment has been described above. As described above, the plasma processing apparatus 1 in the present embodiment includes the electrostatic chuck 1110, the first switch 114, the second switch 117, and the control unit 2. The electrostatic chuck 1110 is provided in the plasma processing chamber 10, has the electrode 1110a therein, and adsorbs the substrate W to be processed using a plasma by a voltage applied to the electrode 1110a. The first switch 114 is provided in the wiring 113 between the electrode 1110a and the variable DC power supply 115 that supplies the voltage to the electrode 1110a. The second switch 117 is provided in the wiring 116 between the electrode 1110a and the detector 118 that detects the voltage of the electrode 1110a. The control unit 2 executes the first determination processing of controlling the first switch 114 and the second switch 117 to be in the closed state, controlling the variable DC power supply 115 such that the H voltage of a predetermined value is output from the variable DC power supply 115, and determining that the first switch 114 and the second switch 117 are in the closed state when the H voltage is detected by the detector 118. Further, after it is determined that the first switch 114 and the second switch 117 are controlled to be in the closed state, the control unit 2 controls the first switch 114 and the second switch 117 to be in the open state to start a processing of the substrate W using a plasma in a state where the electrode 1110a is controlled to be in the floating state. Thus, the plasma processing may be started after confirming that the substrate W is adsorbed to the electrostatic chuck 1110. Further, it may be confirmed that the first switch 114 and the second switch 117 have no open failure.

Further, in the above-described embodiment, the control unit 2 executes the second determination processing. In the second determination processing, the first switch 114 is controlled to be in the closed state, the second switch 117 is controlled to be in the open state, the variable DC power supply 115 is controlled such that the H voltage is output from the variable DC power supply 115, and it is determined that the second switch 117 is in the open state when the L voltage lower than the H voltage is detected by the detector 118. Thus, it may be confirmed that the second switch 117 has no closure failure.

Further, in the above-described embodiment, the control unit 2 executes the third determination processing. In the third determination processing, after the processing of the substrate W using a plasma ends, the first switch 114 and the second switch 117 are controlled to be in the closed state, the variable DC power supply 115 is controlled such that the L voltage is output from the variable DC power supply 115, and it is determined that the electrode 1110a is completely destaticized when the L voltage is detected by the detector 118. After it is determined that the electrode 1110a is completely destaticized, the control unit 2 controls the drive unit that drives the lift pin so as to lift the substrate W by the lift pin. Thus, the substrate W may be prevented from jumping up or cracking after the plasma processing.

Further, in the above-described embodiment, the control unit 2 executes the fourth determination processing. In the fourth determination processing, after the first switch 114 is controlled to be in the closed state and the variable DC power supply 115 is controlled such that the L voltage is output from the variable DC power supply 115, the first switch 114 is controlled to be in the open state, the second switch 117 is controlled to be in the closed state, the variable DC power supply 115 is controlled such that the H voltage is output from the variable DC power supply 115, and it is determined that the first switch 114 is in the open state when the L voltage is detected by the detector 118. Thus, it may be confirmed that the first switch 114 has no closure failure.

Further, in the above-described embodiment, the control unit 2 executes the first determination processing and the second determination processing while the substrate W is carried into the plasma processing chamber 10 before the processing using the plasma starts. Thus, an improved processing throughput may be achieved when performing a plasma processing on a plurality of substrates W.

Further, in the above-described embodiment, the control unit 2 executes the fourth determination processing while the substrate W is carried out from the plasma processing chamber 10 after the processing using a plasma ends. Thus, an improved processing throughput may be achieved when performing a plasma processing on a plurality of substrates W.

Further, the plasma processing method in the above-described embodiment includes step a), step b), step c), and step d). In step a), the variable DC power supply 115 is controlled such that the H voltage of a predetermined value is output from the variable DC power supply 115 that supplies a voltage to the electrode 1110a provided in the electrostatic chuck 1110 that adsorbs the substrate W to be processed by a plasma. In step b), the first switch 114 provided in the wiring 113 between the electrode 1110a and the variable DC power supply 115 and the second switch 117 provided in the wiring 116 between the electrode 1110a and the detector 118 that detects the voltage of the electrode 1110a are controlled to be in the closed state. In step c), when the H voltage is detected by the detector 118, it is determined that the first switch 114 and the second switch 117 are in the closed state. In step d), after it is determined that the first switch 114 and the second switch 117 are in the closed state, the first switch 114 and the second switch 117 are controlled to be in the open state to start the processing of the substrate W using a plasma in a state where the electrode 1110a is controlled to be in the floating state. Thus, the plasma processing may be started after confirming that the substrate W is adsorbed to the electrostatic chuck 1110. Further, it may be confirmed that the first switch 114 and the second switch 117 have no open failure.

[Others]

The technique disclosed herein is not limited to the above-described embodiment, and many modifications are possible within the scope of the gist thereof.

For example, in the above-described embodiment, in the period (a13) after the plasma processing ends, the first switch 114 is controlled to be in the open state, the second switch 117 is controlled to be in the closed state, and the output voltage of the variable DC power supply 115 is controlled to the H voltage. Then, the closure failure of the first switch 114 is determined according to whether or not the L voltage is detected by the detector 118. However, the disclosed technology is not limited to this.

Figure 8:
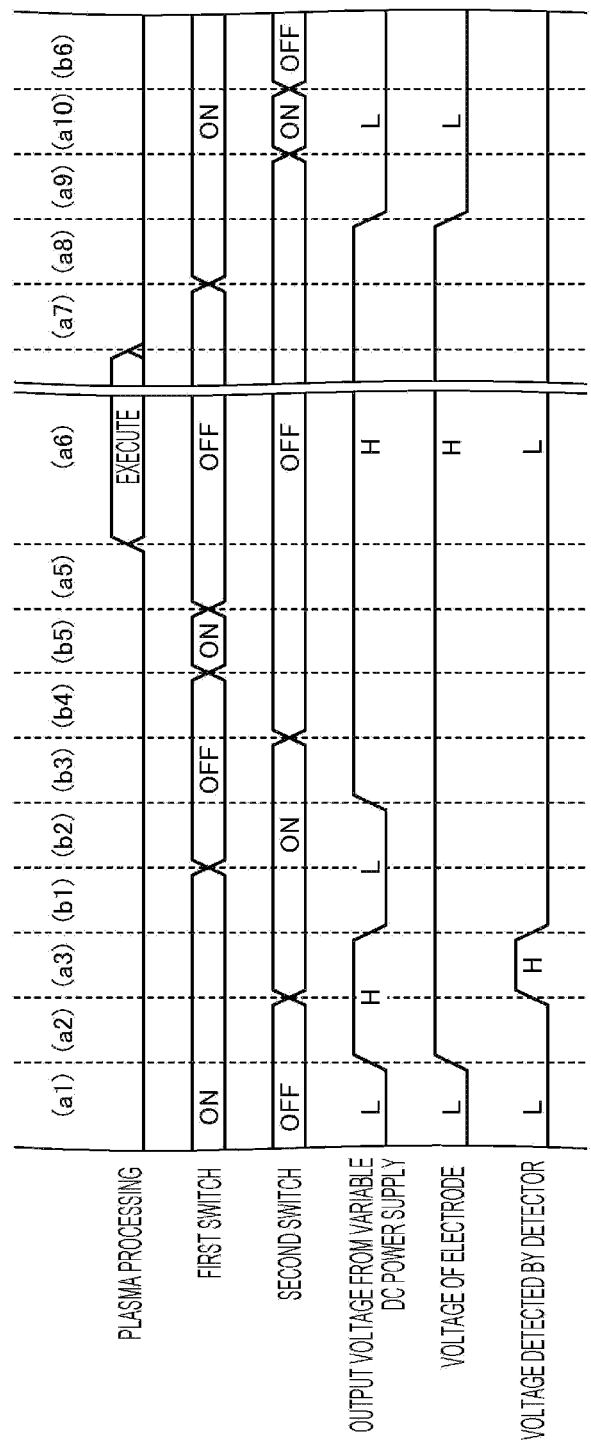
FIG. 8 is a time chart illustrating another example of a control procedure.

FIG. 8 is a time chart illustrating another example of a control procedure. For example, as illustrated in FIG. 8, in the period (b1) after the period (a3), the output voltage of the variable DC power supply 115 is controlled to the L voltage while the second switch 117 remains in the closed state. Thus, the electrode 1110a is destaticized. Then, in the period (b2), the first switch 114 is controlled to be in the open state, and in the period (b3), the output voltage of the variable DC power supply 115 is again controlled to the H voltage. Then, in the period (b3), the closure failure of the first switch 114 may be determined according to whether or not the L voltage is detected by the detector 118. Thus, since the closure failure of the first switch 114 is determined before a plasma processing is started, in the period (a5) before the plasma processing is started, the electrode 1110a may be surely controlled to be in the floating state. Thus, the substrate W may be prevented from jumping up or cracking after the plasma processing.

In the period (b4) after it is determined whether or not the L voltage is detected by the detector 118, the second switch 117 is again controlled to be in the open state. Then, in the period (b5), the first switch 114 is again controlled to be in the closed state, and the voltage output from the variable DC power supply 115 is applied to the electrode 1110a via the first switch 114. Further, after the destaticization of the electrode 1110a is confirmed in the period (a10), in the period (b6), the second switch 117 is again controlled to be in the open state and returns to the initial state. The processings performed in the periods (b1) to (b5) may be executed while the substrate W is carried into the plasma processing chamber 10 before the processing using the plasma starts.

Figure 9:
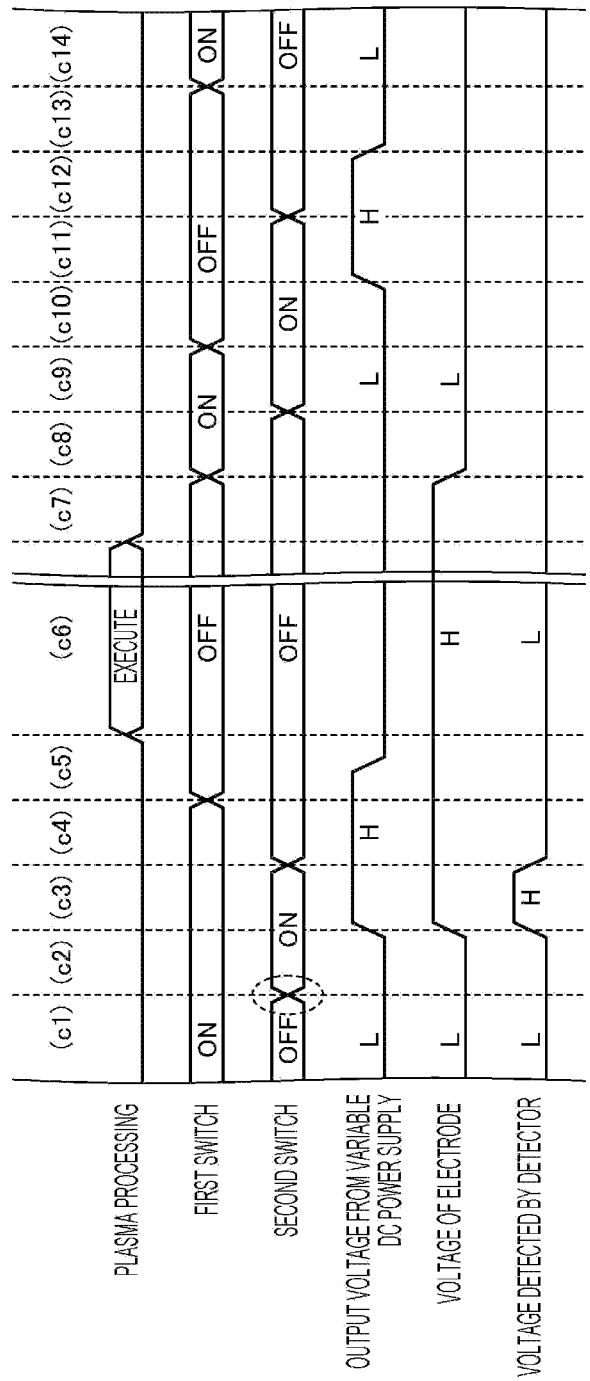
FIG. 9 is a time chart illustrating another example of a control procedure.

Further, in the above-described embodiment, the output voltage of the variable DC power supply 115 is controlled from the L voltage to the H voltage in the period (a2), and the second switch 117 is controlled from the open state to the closed state in the subsequent period (a3). However, the disclosed technology is not limited to this. For example, as illustrated in FIG. 9, the second switch 117 may be controlled from the open state to the closed state in the period (c2), and the output voltage of the variable DC power supply 115 may be controlled from the L voltage to the H voltage in the subsequent period (c3). This may prolong the lifespan of the second switch 117.

Further, in the period (c5) illustrated in FIG. 9, the output voltage of the variable DC power supply 115 may be controlled from the H voltage to the L voltage, so that the output voltage of the variable DC power supply 115 may be maintained at the L voltage during the plasma processing.

Further, in the example of FIG. 9, in the period (c8) after the plasma processing, the electrode 1110a is destaticized, and in the period (c9), the destaticization is confirmed by the detector 118. Then, after the destaticization is confirmed, in the period (c10), the first switch 114 is controlled to be in the open state while the second switch 117 is in the closed state, and in the period (c11), the closure failure of the first switch 114 may be determined.

Further, in the above-described embodiment, the plasma processing system 100 that performs a processing using capacitively coupled plasma (CCP) has been described as an example of a plasma source, but the plasma source is not limited to this. Examples of plasma sources other than the capacitively coupled plasma may include inductively coupled plasma (ICP), microwave excited surface wave plasma (SWP), electron cyclotron resonance plasma (ECP), and helicon wave excited plasma (HWP).

According to various aspects and embodiments of the present disclosure, a plasma processing may be started after confirming that a substrate is adsorbed to an electrostatic chuck.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A plasma processing apparatus comprising:
an electrostatic chuck provided in a chamber, including an electrode therein, and configured to adsorb a substrate to be processed using a plasma by a voltage applied to the electrode;
a first switch provided in a wiring between the electrode and a power supply that supplies the voltage to the electrode;
a second switch provided in a wiring between the electrode and a detector that detects the voltage of the electrode; and
a controller,
wherein the controller is configured to:
execute a first determination processing of controlling the first switch and the second switch to be in a closed state, controlling the power supply to output a first voltage of a predetermined value, and determining that the first switch and the second switch are in the closed state when the first voltage is detected by the detector; and
upon determining that the first switch and the second switch are in the closed state, control the first switch to be in an open state and control the second switch to be in the open state after controlling the first switch to be in the open state, thereby starting a processing of the substrate using the plasma in a state where the electrode is controlled to be in a floating state.

2. The plasma processing apparatus according to claim 1, wherein the controller is configured to execute a second determination processing of controlling the first switch to be in the closed state, controlling the second switch to be in the open state, controlling the power supply to output the first voltage, and determining that the second switch is in the open state when a second voltage lower than the first voltage is detected by the detector.

3. The plasma processing apparatus according to claim 2, wherein the controller is configured to:
execute a third determination processing of, after the processing of the substrate using the plasma ends, controlling the first switch and the second switch to be in the closed state, controlling the power supply to output the second voltage, and determining that an elimination of electricity for the electrode is completed when the second voltage is detected by the detector; and
upon determining that the elimination of electricity for the electrode is completed, control a driver that drives a lift pin so as to lift the substrate by the lift pin.

4. The plasma processing apparatus according to claim 3, wherein the controller is configured to execute a fourth determination processing of controlling the first switch to be in the closed state and controlling the power supply to output the second voltage, and thereafter, controlling the first switch to be in the open state, controlling the second switch to be in the closed state, controlling the power supply to output the first voltage, and determining that the first switch is in the open state when the second voltage is detected by the detector.

5. The plasma processing apparatus according to claim 2, wherein the controller executes the first determination processing and the second determination processing while the substrate is carried into the chamber before the processing of the substrate using the plasma starts.

6. The plasma processing apparatus according to claim 4, wherein the controller executes the fourth determination processing while the substrate is carried out from the chamber after the processing of the substrate using the plasma ends.

7. The plasma processing apparatus according to claim 4, wherein the controller executes the fourth determination processing while the substrate is carried into the chamber before the processing of the substrate using the plasma starts.

* * * * *